(12) United States Patent
Fujiwara (10) Patent No.: US 8,701,062 B2
(45) Date of Patent: Apr. 15, 2014

(54) APPARATUS AND METHOD FOR GENERATING A NETLIST USING NON-UNIQUIFIED MODULE DURING LOGIC SYNTHESIS STAGE

(75) Inventor: Mitsuyoshi Fujiwara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/211,375

(22) Filed: Aug. 17, 2011

(65) Prior Publication Data
US 2012/0054700 A1 Mar. 1, 2012

(30) Foreign Application Priority Data

Sep. 1, 2010 (JP) ................................ 2010-196195

(51) Int. Cl.
*G06F 17/50* (2006.01)

(52) U.S. Cl.
USPC ............ 716/108; 716/113; 716/132; 716/134

(58) Field of Classification Search
USPC .......... 716/100–104, 108, 113–115, 132, 134
See application file for complete search history.

(56) References Cited

U.S. PATENT DOCUMENTS

| | | | |
|---|---|---|---|
| 7,421,674 B2 * | 9/2008 | Nishida | 716/113 |
| 7,966,598 B2 * | 6/2011 | Polomik et al. | 716/130 |
| 2005/0223345 A1 * | 10/2005 | Furusawa | 716/4 |
| 2006/0129964 A1 | 6/2006 | Shibasaki et al. | |

FOREIGN PATENT DOCUMENTS

| | | | |
|---|---|---|---|
| JP | 2005-122577 A | 5/2005 | |
| JP | 2006-164132 A | 6/2006 | |

OTHER PUBLICATIONS www.vlsiip.com/dc_shell/dcug_8.pdf "Design Compiler User guide" (DCUG), Chapter 8, Optimizing Your Design, 1991, www.vlsiip.com/dc_shell/dcug_8.pdf, p. 1-38.*

* cited by examiner

*Primary Examiner* — Nghia Doan
(74) *Attorney, Agent, or Firm* — Fujitsu Patent Center (57) ABSTRACT

A netlist generating apparatus including a memory configured to store logic design data and a processor configured to execute an operation. The operation including selecting paths with which names of instances after logic synthesis match names of modules before being uniquified during the logic synthesis by referring to violation data for paths of the instances and a correspondence table in which the modules are associated with paths of the instances, extracting a path with worst violation data from selected paths by comparing violation data of the selected paths, and adjusting a timing of the extracted path with the worst violation data and generating a netlist.

5 Claims, 11 Drawing Sheets

```
PATH 1
Endpoint:BLK1/INST1  violation:-1.0ns

PATH 2
Endpoint:BLK2/INST1  violation:-2.0ns

PATH 3
Endpoint:BLK3/INST1  violation:-1.5ns

PATH 4
Endpoint:BLK4/INST1  violation:-3.0ns

PATH 5
Endpoint:BLK5/INST2  violation:-1.0ns
```

FIG. 9

| INSTANCE NAME WITH HIERARCHICAL PATH | MODULE NAME |
|---|---|
| BLK1/INST1 | module_A |
| BLK2/INST1 | module_A |
| BLK3/INST1 | module_B |
| BLK4/INST1 | module_A |
| BLK5/INST2 | module_B |

FIG. 10

```
PATH 3
Endpoint:BLK3/INST1  violation:-1.5ns

PATH 4
Endpoint:BLK4/INST1  violation:-3.0ns

PATH 5
Endpoint:BLK5/INST2  violation:-1.0ns
```

FIG. 11

APPARATUS AND METHOD FOR GENERATING A NETLIST USING NON-UNIQUIFIED MODULE DURING LOGIC SYNTHESIS STAGE

CROSS-REFERENCE TO RELATED APPLICATION

This application is based upon and claims the benefit of priority of the prior Japanese Patent Application No. 2010-196195, filed on Sep. 1, 2010, the entire contents of which are incorporated herein by reference.

FIELD

The embodiments discussed herein are related to a netlist generating apparatus and method.

BACKGROUND

There have been logic synthesis tools that automate logic synthesis for generating a netlist (a gate circuit) from a description, such as a register-transfer-level (RTL), of an integrated circuit. The logic synthesis tool generates a netlist from an input RTL so that a circuit is formed of logic gates that are optimum from viewpoints such as timing, area, and power consumption.

With the logic synthesis tool, in cases where a module defined by a user is present in an input RTL, and the module is used as an instance a plurality of times, it is typical that replacement processing of a module name is automatically performed so that the module that each instance refers to is unique. In this case, mapping to a logic gate, timing analysis, and adjustment for improvement in timing are performed after the replacement processing.

The term "module" as used herein means a definition for a logic circuit, and the term "instance" means an entity of a logic circuit itself generated from a definition. The word "unique" represents a state in which there is only one entity for one definition, and the word "nonunique" represents a state in which there are a plurality of entities for one definition.

There is known a technique in which, at the time of timing adjustment during logic synthesis, pins of a module are left as net information, so that layering of the module can be performed again after the logic synthesis, and replacing function blocks organized in a hierarchical manner makes it possible to readily modify logic after the logic synthesis. There are also known a netlist generating method for facilitating analysis with physical information taken into consideration during timing verification, and a technique for performing automatic arrangement with physical information taken into consideration.

Related art is disclosed in Japanese Laid-open Patent Publication No. 2005-122577 and Japanese Laid-open Patent Publication No. 2006-164132.

Unfortunately, conventional techniques in which, during logic synthesis, a module is made unique and a netlist is generated have the following problems.

First, making a module unique results in generation of a plurality of new modules in a netlist, and therefore the need for physical design for each module arises. In the case of a design method mainly using an automatic tool such as an application specific integrated circuit (ASIC), making a module unique hardly affects the man-hours taken for physical design. However, in the case of a design method that mainly involves operation performed by a user, such as in the case of a processor, if a module is made unique, each module generated as a result of this gives rise to the need for an operation used in physical design. This greatly affects the man-hours taken for physical design.

The timings of modules differ from one another depending on what peripheral logics are connected to the modules with which instantiation is performed in a higher layer, and depending on the timing constraints of modules for input and output interfaces. The timing violation values differ between modules with which instantiation is performed.

For example, if a "module_A" having a path 1 and a path 2 is made unique, and, as a result, a "module_A1" and a "module_A2" are obtained, there is a case where the path 1 of the "module_A1" is a target of timing adjustment, and the path 2 is not a target, whereas the path 1 of the "module_A2" is not a target of timing adjustment, and the path 2 is a target.

In this case, the "module_A" with which timing adjustment of the path 1 and timing adjustment of the path 2 are simultaneously performed does not exist. Thus, in the case of putting an optimum module as an IP macro into a library, the optimum module is not selected from modules that have been made unique.

SUMMARY

A netlist generating apparatus including a memory configured to store logic design data and a processor configured to execute an operation. The operation including selecting paths with which names of instances after logic synthesis match names of modules before being uniquified during the logic synthesis by referring to violation data for paths of the instances and a correspondence table in which the modules are associated with paths of the instances, extracting a path with worst violation data from selected paths by comparing violation data of the selected paths, and adjusting a timing of the extracted path with the worst violation data and generating a netlist.

The object and advantages of the invention will be realized and attained at least by the elements, features, and combinations particularly pointed out in the claims.

It is to be understood that both the foregoing general description and the following detailed description are example and explanatory and are not restrictive of the invention, as claimed.

DESCRIPTION OF EMBODIMENTS

Figure 1:
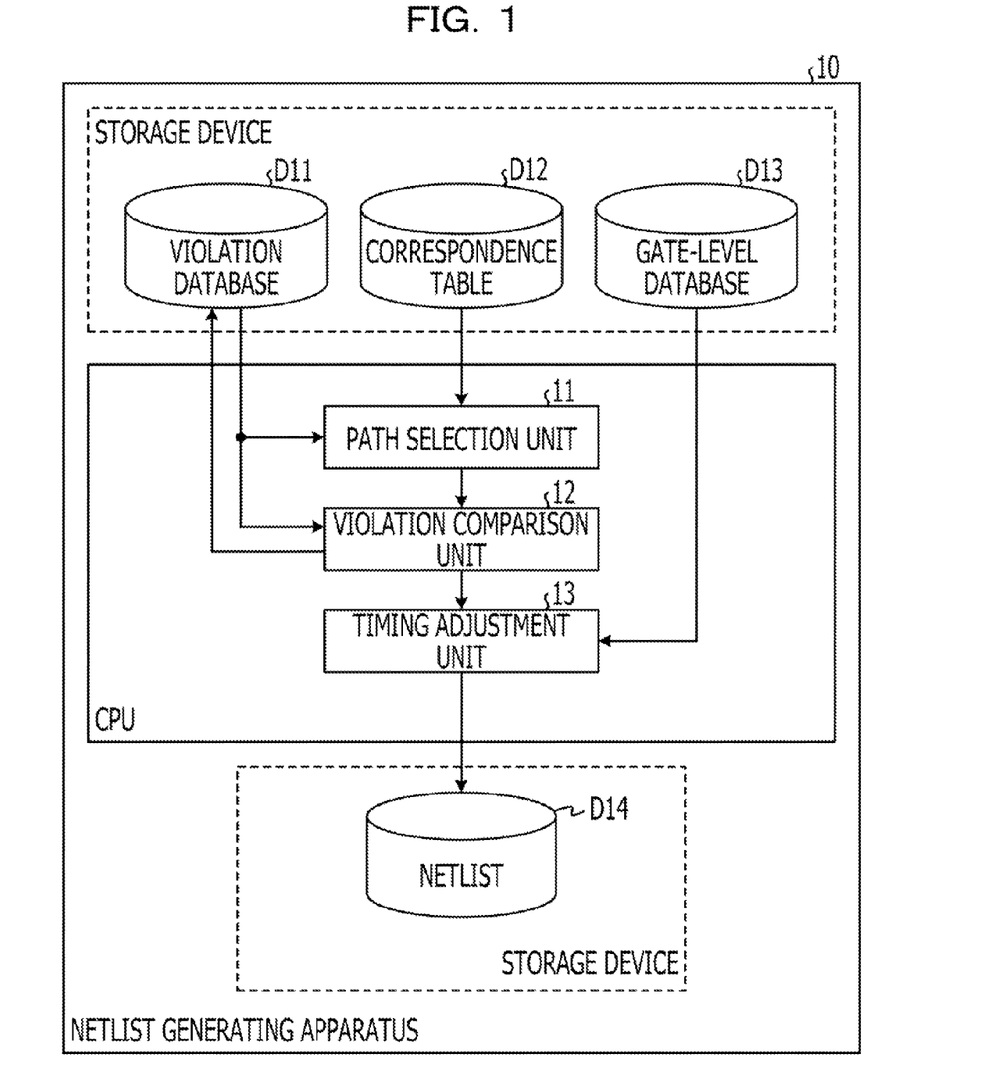
FIG. 1 is a schematic diagram of a netlist generating apparatus according to this embodiment.

FIG. 1 is a schematic diagram of a netlist generating apparatus according to this embodiment. A netlist generating apparatus 10 illustrated in FIG. 1 has a CPU (central processing unit), storage devices, such as a memory, and a hard disk drive (HDD). Processes to be described below that the netlist generating apparatus 10 performs are executed by the CPU. The CPU is configured to perform processes as a path selection unit 11, a violation comparison unit 12, and a timing adjustment unit 13. Data that the CPU reads and data that the CPU outputs are stored in storage devices such as a memory and an HDD.

The path selection unit 11 refers to a violation database D11 and a correspondence table D12, and selects paths with which the names of instances match the names of modules. The correspondence table D12 is a database in which, for logic design data of an integrated circuit obtained by logic synthesis, modules before being made unique during logic synthesis are associated with paths of instances after the logic synthesis. The violation database D11 is a database that holds, as violation data, timing violation values for paths of instances.

The violation comparison unit 12 compares violation data of paths selected by the path selection unit 11, and leaves the path with the worst violation data and deletes other paths.

The timing adjustment unit 13 refers to a gate-level database D13 in which gate-level netlists are registered, and adjusts the timings of the module maintained as a result of processing of the violation comparison unit 12, and generates a netlist D14.

Figure 2:
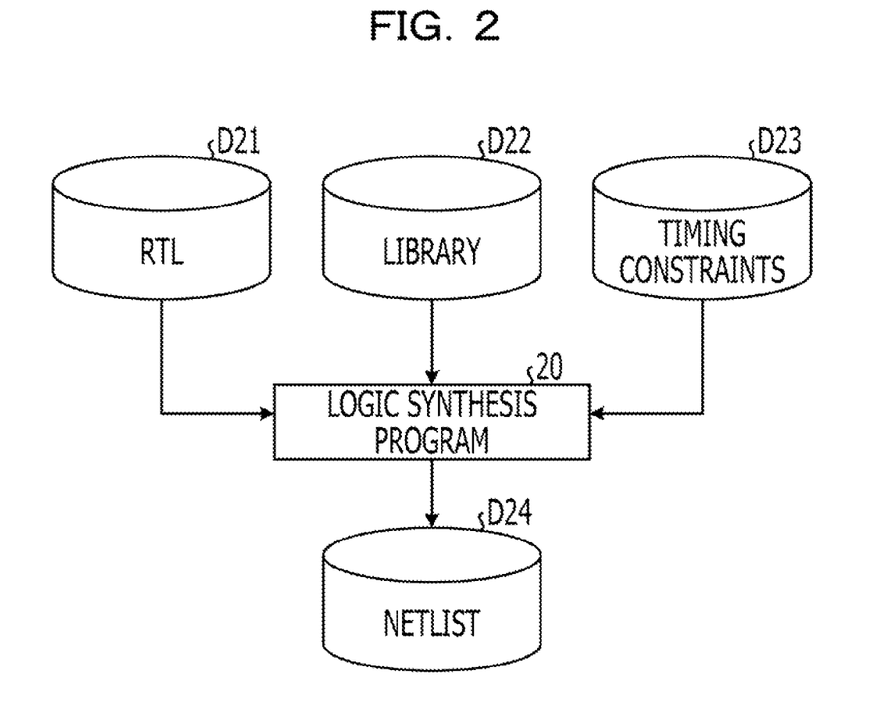
FIG. 2 is a data association diagram in the case where modules are made so that each module is unique, and a netlist is generated, in a comparative example.

FIG. 2 is a data association diagram in the case where modules are made so that each module is unique, and a netlist is generated, as a comparative example. In the case where modules are made so that each module is unique, and a netlist is generated, a logic synthesis program 20 generates a netlist D24 using an RTL_D21, a library D22, and timing constraints D23.

Figure 3:
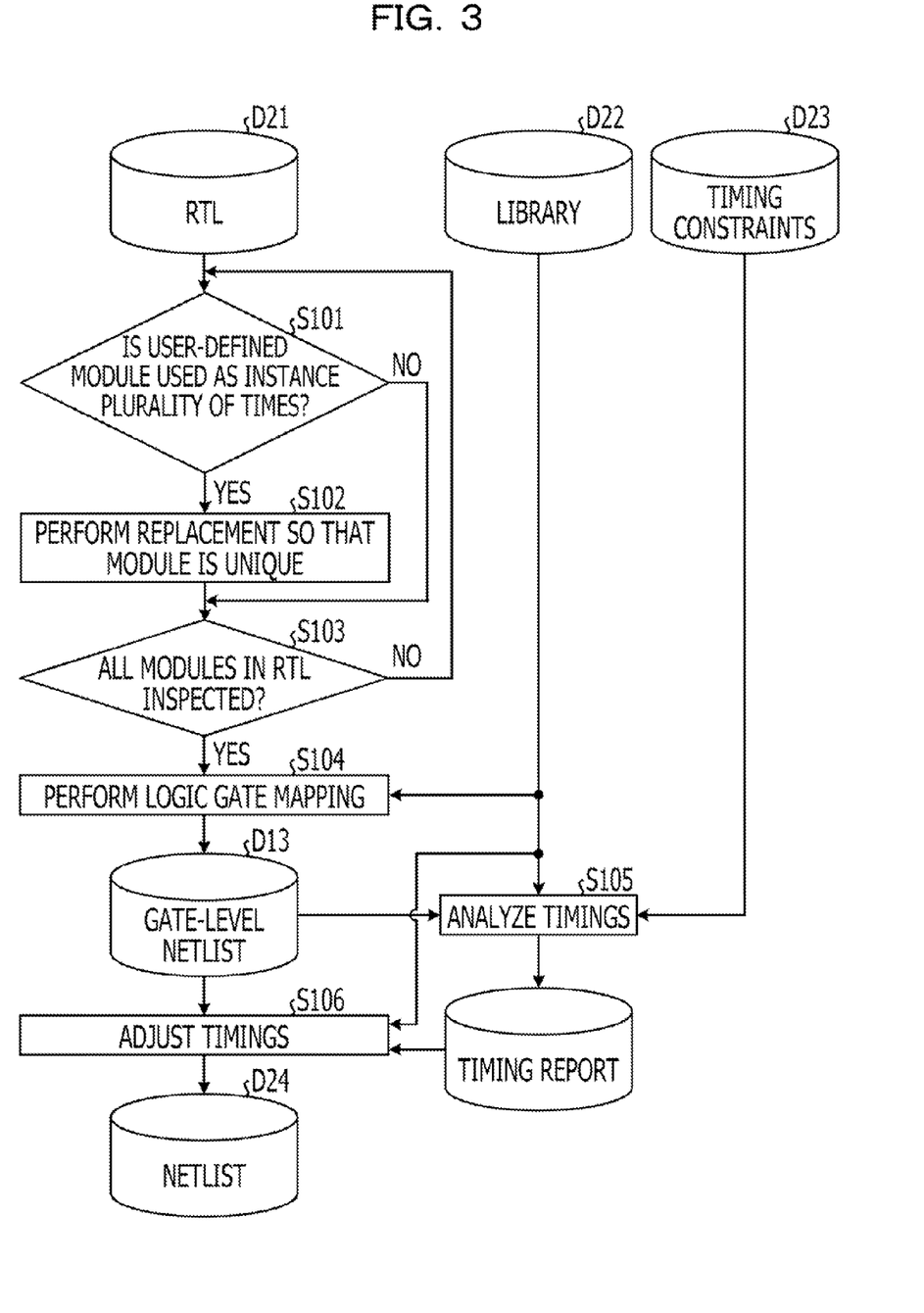
FIG. 3 is a flowchart in the case where modules are made so that each module is unique, and the netlist is generated, in the comparative example.

FIG. 3 illustrates a flowchart of the case where modules are made so that each module is unique, and a netlist is generated, as the comparative example. In the flow illustrated in FIG. 3, the logic synthesis program 20 selects one user-defined module from the RTL_D21, and determines whether the selected user-defined module is used as an instance a plurality of times (S101). If the selected module is used a plurality of times (S101, Yes), then the module is replaced so that the module is unique (S102).

If the selected module is not used a plurality of times (S101, No), or after the module has been made unique in S102, the logic synthesis program 20 determines whether all modules in the RTL_D21 have been inspected (S103), and returns to S101 if there remains a module that has not yet been inspected (S103, No).

After all modules in the RTL_D21 have been inspected (S103, Yes), the logic synthesis program 20 performs logic gate mapping referring to the library D22 (S104), so that a gate-level netlist D13 is generated.

The logic synthesis program 20 analyzes timings referring to the generated gate-level netlist D13, the library D22, and the timing constraints D23 (S105), so that a timing report is generated.

Then, referring to the gate-level netlist D13, the library D22, and a timing report, the logic synthesis program 20 adjusts timings (S106), and outputs the netlist D24.

Figure 4:
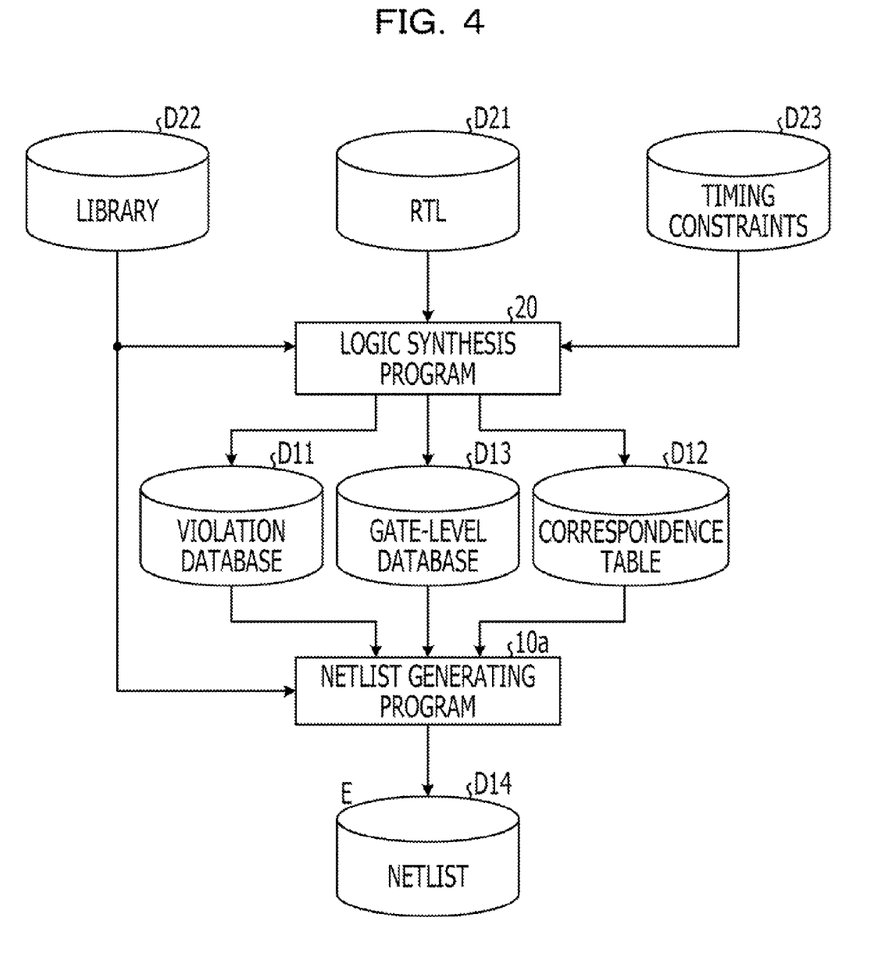
FIG. 4 is a data association diagram of the technique of this disclosure.

FIG. 4 is a data association diagram of the technique of this disclosure. In the technique of this disclosure, the logic synthesis program 20 generates the violation database D11, the correspondence table D12, and the gate-level database D13 from the RTL_D21, the library D22, and the timing constraints D23. A netlist generating program 10a, which causes a computer to operate as the netlist generating apparatus 10, generates the netlist D14 from the library D22, the violation database D11, the correspondence table D12, and the gate-level database D13.

Figure 5:
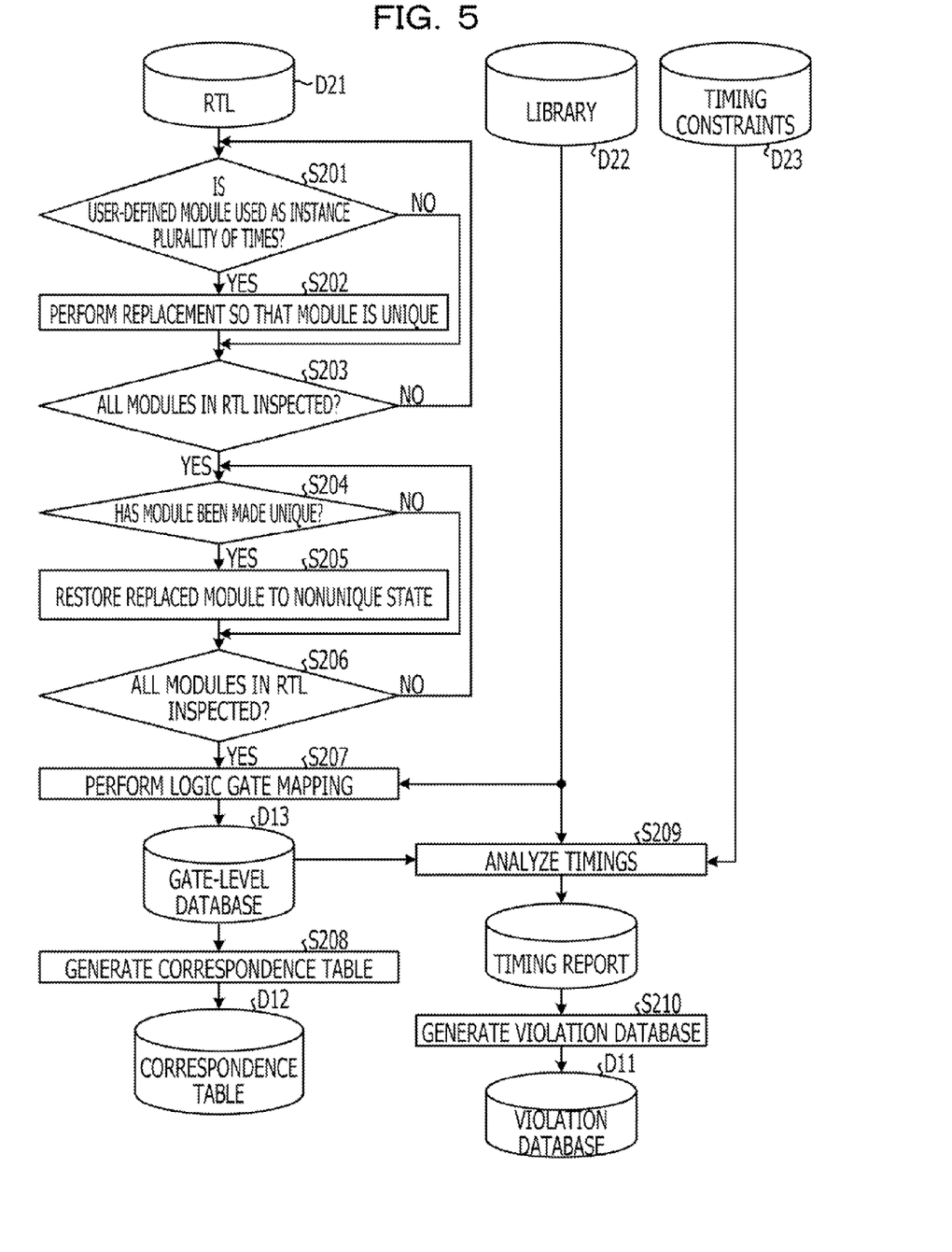
FIG. 5 is a flowchart illustrating a processing operation of a logic synthesis program in FIG. 4.

FIG. 5 is a flowchart illustrating a processing operation of the logic synthesis program 20 in FIG. 4. In the flow illustrated in FIG. 5, the logic synthesis program 20 selects one user-defined module from the RTL_D21, and determines whether the selected user-defined module is used as an instance a plurality of times (S201). If the selected module is used a plurality of times (S201, Yes), then the module is replaced so that the module is unique (S202).

If the selected module is not used a plurality of times (S201, No), or after the module has been made unique in S202, the logic synthesis program 20 determines whether all modules in the RTL_D21 have been inspected (S203), and returns to S201 if there remains a module that has not yet been inspected (S203, No).

After all the modules in the RTL_D21 have been inspected (S203, Yes), the logic synthesis program 20 selects one module and determines whether the selected module is a module that has been made unique (S204). If the selected module is a module that has been made unique (S204, Yes), then the module is restored to its nonunique state and is integrated (S205).

If the selected module has not been made unique (S204, No), or after the module has been made nonunique in S205, the logic synthesis program 20 determines whether all modules in the RTL_D21 have been inspected as to whether they have been made nonunique (S206), and returns to S204 if there remains a module that has not yet been inspected (S206, No).

As such, in the logic synthesis program 20, processing until a module used as an instance a plurality of times in the RTL is replaced so that each module is unique is automated prior to mapping to the logic gate. The technique of this disclosure therefore causes the logic synthesis program 20 to execute processing of restoring a module that has become unique to its original, nonunique state.

After all modules in the RTL_D21 have been inspected as to whether they have been made nonunique (S206, Yes), the logic synthesis program 20 performs logic gate mapping referring to the library D22 (S207), so that the gate-level database D13 is generated.

The logic synthesis program 20 analyzes timings referring to the generated gate-level database D13, the library D22, and the timing constraints D23 (S209), so that a timing report is generated.

Then, the logic synthesis program 20 generates the violation database D11 from the timing report (S210), and generates the correspondence table D12 from the gate-level database D13 (S208).

As such, in a state where nonunique modules are made, the technique of this disclosure performs processing of mapping to a logic gate (S207) and generates the gate-level database D13, which is a database of gate-level netlists. It is to be noted that operations S201 to S207 of FIG. 5 are examples for generating the gate-level database D13, and may be appropriately reordered. For example, the gate-level database D13 can be generated in the order in which operations S204 to S206 are performed after operation S207 has been performed.

Timings are analyzed using a gate-level netlist, and, based on the obtained timing report, paths where violations are detected are stored in a database. This database is the violation database D11.

The correspondence table D12 is a table indicating correspondence between instance names with hierarchical paths and module names for all latches and flip-flops that are present in a circuit. For example, in the case where a path is AAA/BBB/CCC/DDD, the hierarchy instance name is AAA/BBB/CCC, the in-module instance name is DDD, the instance name with a hierarchical path is AAA/BBB/CCC/DDD, and the module name is the name of a module from which DDD is instantiated.

Figure 6:
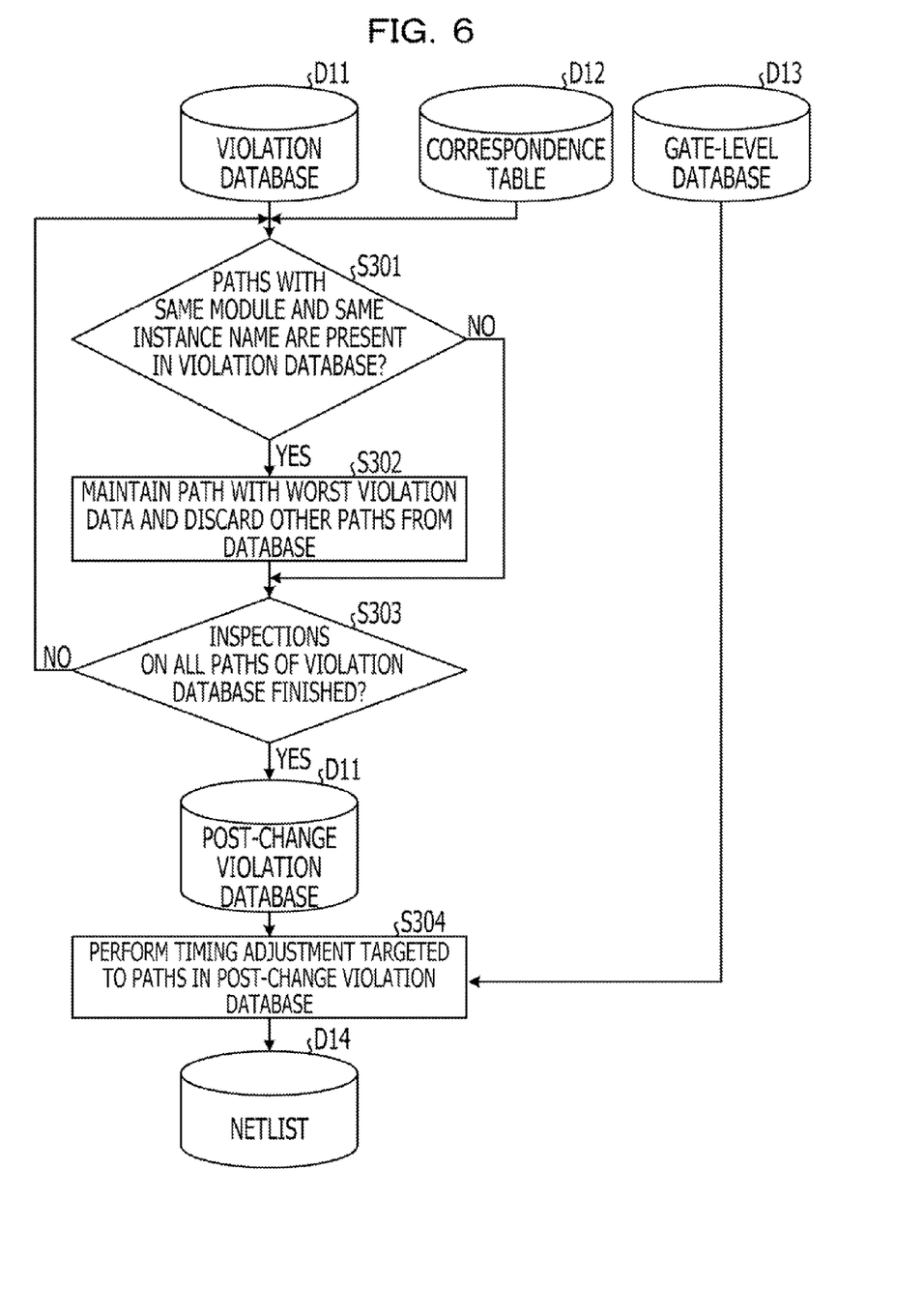
FIG. 6 is a flowchart illustrating a processing operation of a netlist generating program in FIG. 4.

FIG. 6 is a flowchart illustrating a processing operation of the netlist generating program 10a in FIG. 4. In the flow illustrated in FIG. 6, if paths with the same module and the same instance name are present in the violation database D11 (S301, Yes), then the netlist generating program 10a maintains the path with the worst violation data, among the paths with the same module and the same instance name, and discards other paths from the database (S302). In this way, the path with the worst violation data is extracted.

After S302, or if a path with the same module and the same instance name is absent (S301, No), the netlist generating program 10a determines whether the inspections of S301 have been finished for all paths of the violation database D11.

If there remains a path on which the inspection of S301 has not yet been finished (S303, No), then the netlist generating program 10a returns to S301. If the inspections of S301 have been finished on all paths of the violation database D11 (S303, Yes), then the netlist generating program 10a performs timing adjustment targeted to paths remaining in the post-change violation database D11 referring to the gate-level database D13 (S304). As a result of this timing adjustment, the netlist D14 is generated.

As such, with inputs from the gate-level database D13, the violation database D11, and the correspondence table D12 obtained by the processing in FIG. 5, the technique of this disclosure adjusts timings of a netlist in which nonunique modules exist. Therefore, timing adjustment for the netlist in which nonunique modules exist can be realized.

Among paths present in the violation database, all paths having the same in-module instance name and the same module name are detected. A comparison on a violation value is made among the detected paths. A path with a violation value representing the worst violation is selectively maintained in the violation database D11, and timing adjustment processing is performed. In this way, timings are adjusted with reference to the violation value representing the worst violation. Therefore, all violations of timing paths can be eliminated even if the violations are not the worst.

Figure 7:
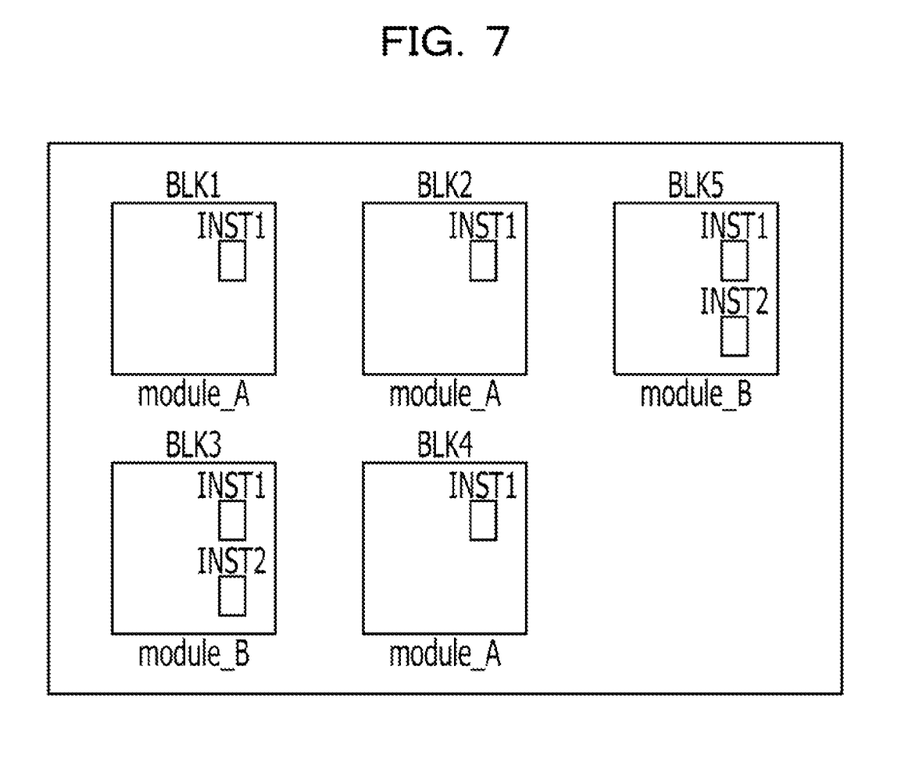
FIG. 7 is a specific example of a gate-level database.

FIG. 7 is a specific example of the gate-level database D13. A circuit block BLK1 is generated from a module A and has an instance INST1. A circuit block BLK2 is generated from the module A and has the instance INST1. A circuit block BLK3 is generated from a module B and has the instance INST1 and an instance INST2. A circuit block BLK4 is generated from the module A and has the instance INST1. A circuit block BLK5 is generated from the module B and has the instance INST1 and the instance INST2.

Figure 8:
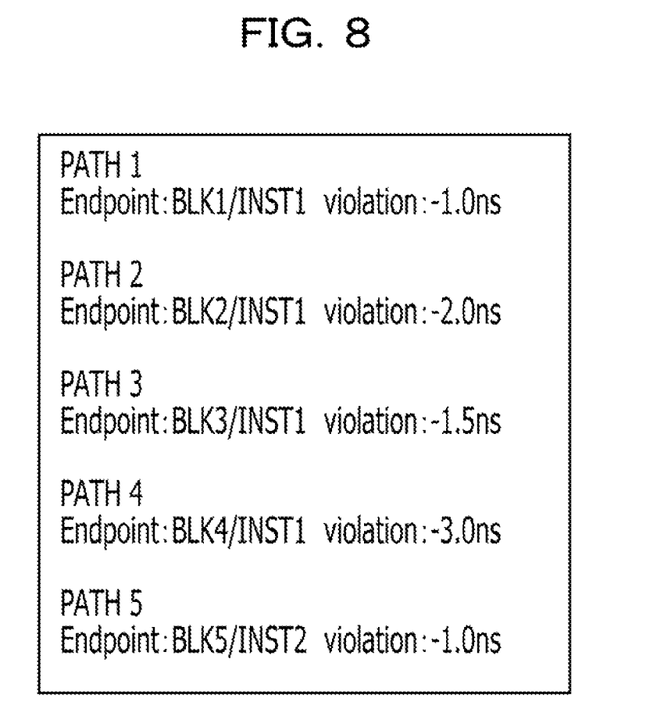
FIG. 8 is a specific example of a violation database.

FIG. 8 is a specific example of the violation database D11. Timings are analyzed by the logic synthesis program 20 with the gate-level database D13 of FIG. 6. From a timing report generated here, a violation database as illustrated in FIG. 8 is generated.

Specifically, in FIG. 8, for the path 1, "Endpoint: BLK1/INST1 violation: −1.0 ns" is given; for the path 2, "Endpoint: BLK2/INST1 violation: −2.0 ns" is given; for a path 3, "Endpoint: BLK3/INST1 violation: −1.5 ns" is given; for a path 4, "Endpoint: BLK4/INST1 violation: −3.0 ns" is given; and for a path 5, "Endpoint: BLK5/INST2 violation: −1.0 ns" is given.

Figure 9:
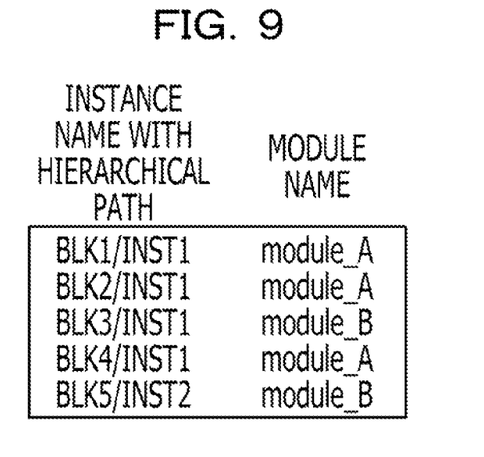
FIG. 9 is a specific example of a correspondence table.

The logic synthesis program 20 generates a correspondence table detailing the correspondence between instance names with hierarchical paths and module names as illustrated in FIG. 9. In FIG. 9, "BLK1/INST1" corresponds to "module_A", "BLK2/INST1" corresponds to "module_A", "BLK3/INST1" corresponds to "module_B", "BLK4/INST1" corresponds to "module_A", and "BLK5/INST2" corresponds to "module_B".

The gate-level database D13, violation database D11, and correspondence table D12 are input to the netlist generating program 10a. As processing before timing adjustment of modules in their nonunique states, paths with which module names match instance names are selected, and the path with the worst violation data is maintained.

Specifically, among paths related to "module_A" that are present in the violation database illustrated in FIG. 8, the path with the worst violation data is searched for. In the correspondence table of FIG. 9, an instance name "BLK1/INST1" with a hierarchical path "path 1" and an instance name "BLK2/INST1" with a hierarchical path "path 2" have the same in-module instance name "INST1" and the same module name "module_A". Therefore, values of violations are compared between "path 1" and "path 2", and "path 2" regarded as the worst is maintained in the violation database.

Likewise, "path 2" and "path 4" corresponding to "module_A" are compared, and "path 4" is maintained in the database because the violation of "BLK4/INST1" has the worst value. For "module_B", processing is performed similarly. It is to be noted that "path 3" and "path 5" are different in an in-module instance name, and therefore both the paths are maintained in the database. This results in a violation database illustrated in FIG. 10.

Figure 10:
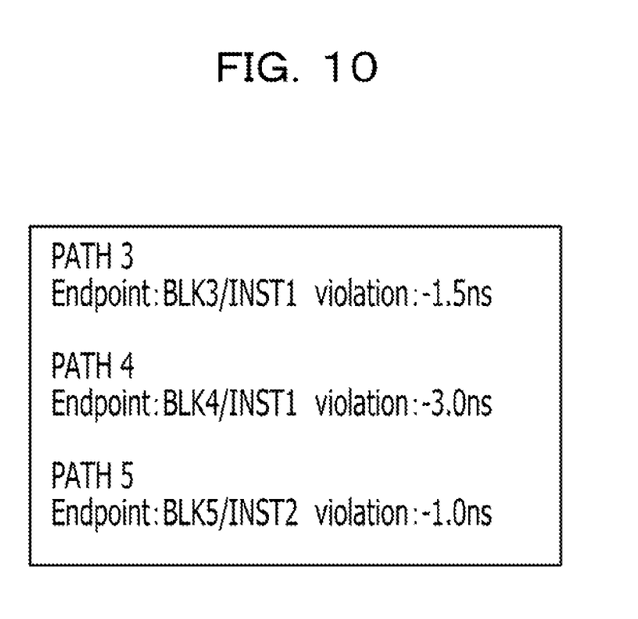
FIG. 10 is a specific example of an updated violation database.
Figure 11:
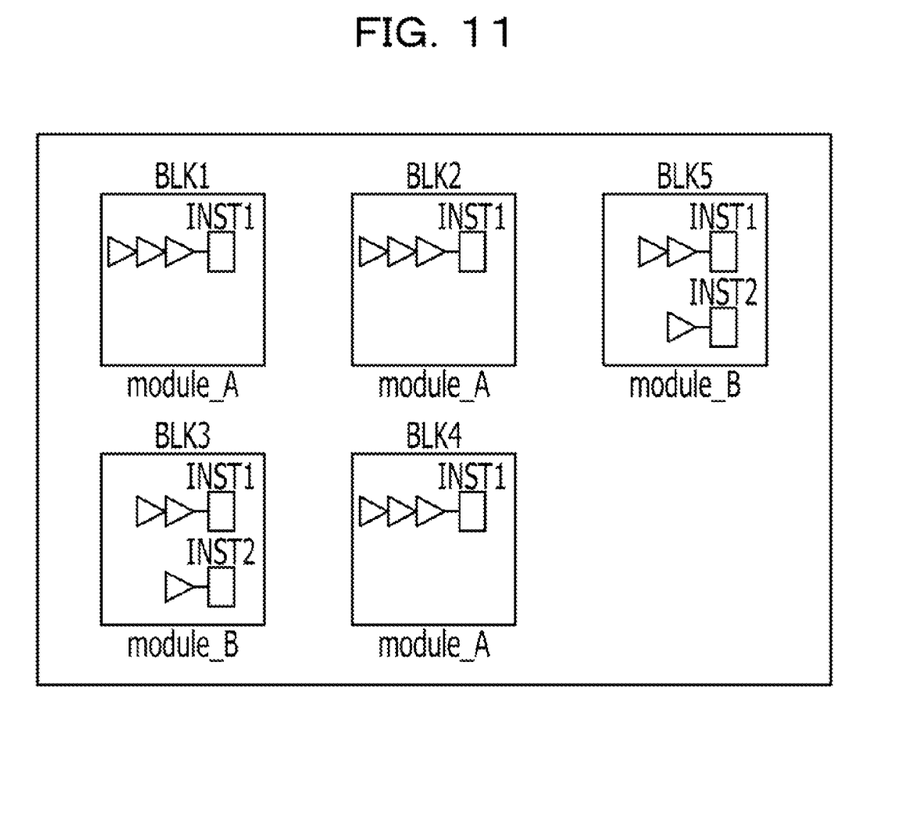
FIG. 11 is a specific example of a netlist after timing adjustment by a method of the embodiment.

For paths that are present in the violation database illustrated in FIG. 10, timing adjustment is performed to generate a netlist. This result is illustrated in FIG. 11. In FIG. 11, the circuit blocks BLK1, BLK2, and BLK4 generated from the module A have the same internal configuration. Likewise, the circuit blocks BLK3 and BLK5 generated from the module B have the same internal configuration.

As described above, with a program, an apparatus and a method according to this embodiment, for logic design data of an integrated circuit obtained by logic synthesis, a violation database and a correspondence table are referred to, and paths with which names of instances match names of modules are selected. Violation data is compared among the selected paths, and the path with the worst violation data is maintained and other paths are discarded. For the module remaining as a result of this, timings are adjusted, so that a netlist is generated. Therefore, regarding a module used as an instance a plurality of times in an RTL, a netlist is generated with the module in its nonunique state. Thus, timing adjustment covering all cases can be performed so as to reduce or prevent the number of objects which a nonunique module is in charge of from becoming insufficient. Such a technique is particularly effective for physical design mainly using manual arrangement.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiment(s) of the present inven-

What is claimed is:

1. A computer-readable, non-transitory medium storing therein a netlist generating program that causes a computer to execute an operation, the operation comprising:

selecting paths with which names of instances after logic synthesis match names of modules before being uniquified during the logic synthesis by referring to violation data for paths of the instances and a correspondence table in which the modules are associated with paths of the instances;

extracting a path with worst violation data from selected paths by comparing violation data of the selected paths; and adjusting a timing of the extracted path with the worst violation data and generating a netlist.

2. The computer-readable, non-transitory medium according to claim 1, wherein the operation further comprises:

performing logic synthesis of the logic design data; and integrating, into one module, a plurality of modules that have been made nonunique from the one module in the logic design data during the logic synthesis.

3. The computer-readable, non-transitory medium according to claim 1, wherein the operation further comprises:

generating the correspondence table from a gate-level netlist obtained as a result of logic gate mapping;

performing timing analysis of the gate-level netlist; and generating the violation data from a result of the timing analysis.

4. A netlist generating apparatus comprising:

a memory configured to store logic design data; and a processor configured to execute an operation, the operation comprising:

selecting paths with which names of instances after logic synthesis match names of modules before being uniquified during the logic synthesis by referring to violation data for paths of the instances and a correspondence table in which the modules are associated with paths of the instances;

extracting a path with worst violation data from selected paths by comparing violation data of the selected paths; and adjusting a timing of the extracted path with the worst violation data and generating a netlist.

5. A netlist generating method executed by a computer, the netlist generating method comprising:

selecting paths with which names of instances after logic synthesis match names of modules before being uniquified during the logic synthesis by referring to violation data for paths of the instances and a correspondence table in which the modules are associated with paths of the instances;

extracting a path with worst violation data from selected paths by comparing violation data of the selected paths; and adjusting a timing of the extracted path with the worst violation data and generating a netlist.

* * * * *

UNITED STATES PATENT AND TRADEMARK OFFICE
CERTIFICATE OF CORRECTION

PATENT NO. : 8,701,062 B2  
APPLICATION NO. : 13/211375  
DATED : April 15, 2014  
INVENTOR(S) : Mitsuyoshi Fujiwara

Page 1 of 1

It is certified that error appears in the above-identified patent and that said Letters Patent is hereby corrected as shown below:

Title Page, item (54) and in the Specification, Column 1, line 1, title, delete and insert the following:

--APPARATUS AND METHOD FOR GENERATING A NETLIST USING NON-UNIQUIFIED MODULES DURING LOGIC SYNTHESIS STAGE--.

Signed and Sealed this  
Sixteenth Day of September, 2014

Michelle K. Lee  
*Deputy Director of the United States Patent and Trademark Office*